US006606725B1

(12) United States Patent
Wang et al.

(10) Patent No.: US 6,606,725 B1
(45) Date of Patent: Aug. 12, 2003

(54) MAP DECODING FOR TURBO CODES BY PARALLEL MATRIX PROCESSING

(75) Inventors: Duanyi Wang, Princeton, NJ (US); Hisashi Kobayashi, Princeton, NJ (US); Jay Bao, Bridgewater, NJ (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 09/558,440

(22) Filed: Apr. 25, 2000

(51) Int. Cl.$^7$ ............................................. H03M 13/45
(52) U.S. Cl. ........................ 714/755; 714/780; 714/794
(58) Field of Search ................................ 714/755, 780, 714/794

(56) References Cited

U.S. PATENT DOCUMENTS

| | | | |
|---|---|---|---|
| 5,446,747 A | 8/1995 | Berrou ......................... | 371/45 |
| 5,721,745 A | 2/1998 | Hladik et al. ................. | 371/43 |
| 5,734,962 A | 3/1998 | Hladik et al. ............... | 455/12.1 |
| 5,933,462 A * | 8/1999 | Viterbi et al. ............... | 375/341 |
| 6,023,783 A | 2/2000 | Divsalar et al. ............ | 714/792 |
| 6,128,765 A * | 10/2000 | Ross et al. ................... | 714/786 |
| 6,226,773 B1 * | 5/2001 | Sadjadpour ................. | 714/794 |
| 6,343,368 B1 * | 1/2002 | Lerzer ......................... | 714/796 |
| 6,400,290 B1 * | 6/2002 | Langhammer et al. ........ | 341/94 |
| 6,477,679 B1 * | 11/2002 | Such et al. .................. | 714/755 |
| 6,516,437 B1 * | 2/2003 | Van Stralen et al. ........ | 714/755 |
| 6,516,444 B1 * | 2/2003 | Tsuguo ....................... | 714/795 |
| 6,526,539 B1 * | 2/2003 | Yano et al. ................. | 714/794 |

OTHER PUBLICATIONS

Valenti et al., "Performance of Turbo Codes in Interleaved Flat Fading Channels with Estimated channel State Information".
Hall et al., "Turbo Codes for Noncoherent Channels".
Bahl et al., "Optimal Decoding of Linear Codes for Minimizing Symbol Error Rate"; IEEE Transactions on Information Theory, Mar., 1974, pp. 284–287.
Berrou et al.; "Near Optimum Error Correcting Coding and Decoding: Turbo–Codes"; IEEE Transactions on Communications, vol. 44, No. 10, Oct. 1996, pp. 1261–1271.
CAS 5093 Turbo–Code CODEC; comatlas.
Turbo Code Project Page; www.ie.cuhk.edu.hk.
MAP04T Very High Speed MAP Decoder; Product Specification; Small World Communications, Oct. 25, 1999 (Version 1.0).
AHA4501 Astro Turbo product Code Evaluation Module, Product Summary; Efficient Channel Coding, Inc., 1999.
Technical Description of Turbo Product Codes, Version 4.0; Efficient Channel Coding, Inc., Jun. 1999.

\* cited by examiner

*Primary Examiner*—Stephen M. Baker
(74) *Attorney, Agent, or Firm*—Dirk Brinkman; Andrew J. Curtin

(57) ABSTRACT

A matrix transform method and circuit provides for MAP decoding of turbo codes. The method begins by initializing a forward recursion probability function vector $\alpha_0$, and a backward recursion probability function vector $\beta_N$. Then, transition probability matrices $\Gamma(R_k)$ and $\Gamma_i(R_k)$ are determined according to each received symbol of the sequence $R_1^N$. And then, values of $\alpha_k$, corresponding to the received $R_k$ are determined according to $\Gamma(R_k)$. At the same time of determining $\alpha_k$, a plurality of multiplacation on $\Gamma(R_k)$ and $\Gamma_i(R_k)$ are accomplished in parallel. By making use of the results of the matrix multiplications, after receiving the complete symbol sequence $R_1^N$, values of all of the backward recursion probability vector $\beta_k$, where $k=1, 2, \ldots, N-1$, are determined in parallel, and the log likelihood ratio for every decoded bit $d_k$, $k=1, 2, \ldots, N$, are also determined in parallel. The circuit performs successive decoding procedures in parallel using a set of regular matrix operations. These operations substantially accelerate the decoding speed and reduce the computational complexity, and are particularly suited for implementation in special-purpose parallel processing VLSI hardware architectures. Using shift registers, the VLSI implementation effectively reduces memory requirements and simplifies complicated data accesses and transfers.

13 Claims, 5 Drawing Sheets

MAP DECODING FOR TURBO CODES BY PARALLEL MATRIX PROCESSING

FIELD OF THE INVENTION

The present invention relates generally to error-correcting decoding for digital signals received via noisy channels and, more particularly, to a maximum a posteriori (MAP) decoding method for turbo codes based on parallel matrix processing.

BACKGROUND OF THE INVENTION

In mobile wireless communications, multipath fading, intersymbol interference and thermal noise induced by electronic devices lead to an abundance of transmission errors. Channel coding is a common method for obtaining a sufficient quality signal at a receiver. An overview of the most widespread methods for channel coding is presented by Proakis in "*Digital Communications*," McGraw-Hill International Editions, 1989.

Recently, a novel class of binary parallel concatenated recursive systematic convolutional codes, termed turbo codes, originally described by Berrou et al. in "Near Shannon Limit Error-Correcting Coding and Decoding: Turbo-Codes", *Proceedings of IEEE International Conference on Communications*, 1993, pp. 1064–1070, have received a great deal of attention, see also U.S. Pat. No. 5,406,570, "Method for a maximum likelihood decoding of a convolutional code with decision weighting, and corresponding decoder" issued to Berrou on Apr. 11, 1995. Turbo codes can provide excellent error correcting capability and are, therefore, very attractive for mobile wireless applications to combat channel degradation.

One of the key strategies of turbo codes is an iterative (turbo) decoding mode with soft constituent decoder information exchange, see Andersen, "The TURBO Coding Scheme," Report IT-146 ISSN 0105-854, Institute of Telecommunication, Technical University of Denmark, December 1994, and Robertson, "Illuminating the Structure of Code and Decoder of Parallel Concatenated Recursive Systematic (Turbo) Codes," *Proceedings of IEEE GLOBE-COM Conference*, 1994, pp. 1298–1303. Maximum a posteriori (MAP) based methods have proven to be the best for implementing iterative decoding of turbo codes.

A MAP method is based on the BCJR method, see Bahl et al. in "Optimal Decoding of Linear Codes for Minimizing Symbol error Rate," *IEEE Transactions on Information Theory*, Mar. 1974, pp. 284–287). The MAP method makes optimum symbol-by-symbol decisions, and also provides soft reliability information that is necessary in iterative decoding. There is an increasing demand for practical MAP decoders so that turbo codes can be used in a wide range of applications, such as third generation wideband DS-CDMA mobile communication systems.

However, the conventional MAP method suffers serious drawbacks that make it difficult to achieve low-cost VLSI implementations. Most notably, the complex operations for forward-backward recursions required by the MAP method incur decoding delays and a substantial amount of storage. Most prior art MAP decoders require a significant complexity, compared with the convolutional-code decoders, for example, see Comatlas, Chateaubourg, France, "CAS 5093 Turbo-Code Codec, data Sheet," August 1994, Efficient Channel Coding, Inc., Eastlake Ohio, USA, "ECC Turbo product code technology," March 1998, and Small World Communications, Adelaide, Australia, "MAP04 and MAP04A 16 State MAP Decoders," April 1998.

Therefore, it is desired to provide an efficient low-complexity MAP decoder circuit and method which makes possible a practical VLSI implementation without suffering a substantial performance penalty.

SUMMARY OF THE INVENTION

The present invention provides a matrix transform method and apparatus for MAP decoding of turbo codes. In this invention, the successive decoding procedures are performed in parallel and well formulated into a set of simple and regular matrix operations. These operations substantially accelerate decoding and reduce the computational complexity, and are particularly suited for implementation in special-purpose parallel processing VLSI hardware architectures.

Using shift registers, the implementation schemes for the invented matrix MAP decoding effectively reduce the memory requirement and simplify complicated data accesses and transfers, compared with what is known in the prior art.

More particularly, the invention provides a method and apparatus for fast implementation of MAP decoding a noise corrupted turbo-encoded sequence $R_1^N = \{R_1, R_2, \ldots, R_N\}$. In general, the method begins with initializing forward and backward recursion probability function vectors $\alpha_0$ and $\beta_N$ by setting $\alpha_0 = [1, 0, 0, \ldots, 0]$ and $\beta_N = [1, 1, \ldots, 1]$, respectively. Then, the method determines transition probability matrices $\Gamma(R_k)$ and $\Gamma_i(R_k)$ for each received sequence $R_k$. Then, values of the vector $\alpha_k$ are determined according to $\Gamma(R_k)$. As $\alpha_k$ is determined, the method does multiplications on $\Gamma(R_k)$ s and $\Gamma_1(R_k)$.

After receiving the complete sequence $R_1^N$, an embodiment of the matrix MAP decoding method determines all values of the vector $\beta_k^T$, k=1, 2, ... N-1 in parallel by making use of the results of the above matrix multiplication on $\Gamma(R_k)$, finally the method determines the log likelihood ratios for all of decoded bits, i.e., $\Lambda(d_k)$, k=1, 2, ... N, in parallel.

An alternative embodiment directly determines the final log likelihood ratios for all of decoded bits, i.e., $\Lambda(d_k)$, k=1, 2, ... N, in parallel, by making direct use of the results of the multiplications on $\Gamma(R_k)$s and $\Gamma_1(R_k)$.

DETAILED DESCRIPTION OF THE PREFERRED EMBODIMENTS

Figure 1:
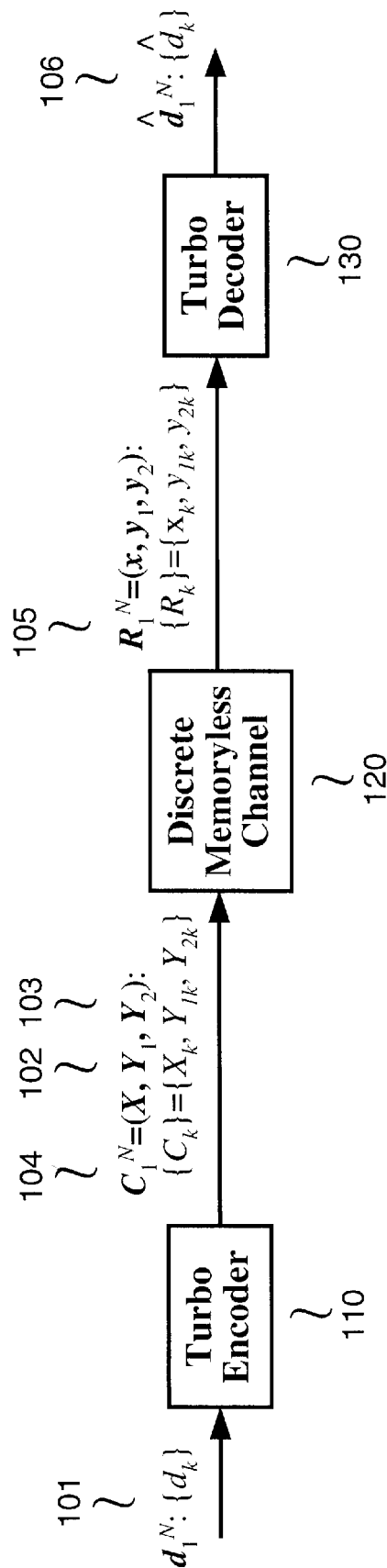
FIG. 1 shows a transmission system that includes a turbo decoder according to the invention.

FIG. 1 shows a system 100 including a turbo encoder 10, a discrete memoryless channel 120, and a turbo decoder 130 according to the invention.

The turbo encoder 110 is constructed by a parallel concatenation of two, usually identical recursive systemic convolutional (RSC) constituent encoders. A turbo internal interleaver is disposed between the RSC encoders. Generally, more RSC encoders and interleavers may be adopted to construct the turbo encoder 110.

Each RSC encoder has ½ rate, and memory v. For each input sequence block $d_1^N = \{d_1, d_2, \ldots, d_N\}$ 101 of length N, where $d_k \in GF(2)$, the two RSC encoders operate on different versions and produce parity sequences $Y_1 = \{Y_{11}, Y_{12}, \ldots, Y_{1N}\}$ 102 and $Y_2 = \{Y_{21}, Y_{22}, \ldots, Y_{2N}\}$ 103, respectively. The overall output sequence $C_1^N = \{C_1, C_2, \ldots, C_N\}$ 104 from the turbo encoder is the sum of the three parts, i.e., $C_1^N = (X, Y_1, Y_2)$, where $C_k = (X_k, Y_{1k}, Y_{2k})$ refers to the information bit $X_k$ and the parity bits $Y_{1k}, Y_{2k}$, respectively.

The turbo encoded output sequence 104 is transmitted over the discrete memoryless channel 120. As stated above, the channel 120 often exists in a hostile environment leading to an abundance of bit errors. It is a goal of our invention to detect and correct these errors by efficient methods that can be implemented with VLSI circuits.

At the receiving side, a received sequence is applied to the turbo decoder 130. The sequence is denoted by $R_1^N = \{R_1, R_2, \ldots, R_N\}$ 105, where $R_1^N = (x, y_1, y_2)$, and $R_k = (x_k, y_{1k}, y_{2k})$ is the noise corrupted version of $C_k$ at time k. The turbo decoder 130 includes two constituent decoders according to our invention.

Preferably, the decoders are implemented by VLSI circuits. Interleavers/deinterleavers, with the same interleaving scheme used in the turbo encoder 110, are disposed between the decoders. Additional RSC constituent decoders can be used to match the number of RSC encoders used in the turbo encoder 110. The output of the decoder 130 is the decoded symbol sequence block 106.

Conventional Expression of MAP Method for Turbo Codes

A state of the RSC encoder at time k is $S_k$. $S_k$ takes on an integer value between 0 and $M-1 (M=2^v)$. The k-th information bit $d_k$ drives the encoder to change its state from $S_{k-1}$ to $S_k$. This is called an encoder state transition. In the conventional MAP method, the soft output for each decoded bit $d_k$ is determined from the log-likelihood ratio (LLR):

$$\Lambda(d_k) = \ln \frac{P_r\{d_k = 1 \mid R_1^N\}}{P_r\{d_k = 0 \mid R_1^N\}} = \quad (1)$$

$$\ln \frac{\sum_{m=0}^{M-1} \sum_{m'=0}^{M-1} \gamma_1(R_k, m', m)\alpha_{k-1}(m')\beta_k(m)}{\sum_{m=0}^{M-1} \sum_{m'=0}^{M-1} \gamma_0(R_k, m', m)\alpha_{k-1}(m')\beta_k(m)}$$

where the values of the forward and backward recursion probability function vectors $\alpha_k(m)$ and $\beta_k(m)$ are recursively obtainable from a branch transition probability $\gamma_i(R_k, m, m')$, respectively:

$$\alpha_k(m) = P_r\{S_k = m \mid R_1^k\} = \frac{\sum_{m'} \sum_{i=0}^{1} \gamma_i(R_k, m', m)\alpha_{k-1}(m')}{\sum_{m=0}^{M-1} \sum_{m'=0}^{M-1} \sum_{i=0}^{1} \gamma_i(R_k, m', m)\alpha_{k-1}(m')} \quad (2)$$

and $$\beta_k(m) = \frac{P_r\{R_{k+1}^N \mid S_k = m\}}{P_r\{R_{k+1}^N \mid R_1^k\}} = \frac{\sum_{m'} \sum_{i=0}^{1} \gamma_i(R_k, m, m')\beta_{k+1}(m')}{\sum_{m=0}^{M-1} \sum_{m'=0}^{M-1} \sum_{i=0}^{1} \gamma_i(R_k, m', m)\alpha_k(m')}, \quad (3)$$

and $$\gamma_i(R_k, m', m) = P_r\{d_k = i, S_k = m, R_k \mid S_{k-1} = m'\} \quad (4)$$

is determined according to the transition probabilities of the channel and the RSC encoders.

Simplified Expression of MAP Method for Turbo Codes

Before describing the matrix MAP decoding methods and apparatus of our invention, we first simplify the expressions (2) and (3) of the conventional MAP method as follows.

Using the joint probability $\lambda_k^i(m)$ as defined by Berrou, see above:

$$\lambda_k^i(m) = P_r\{d_k = i, s_k = m \mid R_1^N\}, \quad (5)$$

we have:

$$\Lambda(d_k) = \ln \frac{\sum_{m=0}^{M-1} \lambda_k^1(m)}{\sum_{m=0}^{M-1} \lambda_k^0(m)} = \ln \frac{\sum_{m=0}^{M-1} \sum_{m'=0}^{M-1} P_r\{d_k = 1, S_k = m, S_{k-1} = m', R_1^{k-1}, R_k, R_{k+1}^N\}}{\sum_{m=0}^{M-1} \sum_{m'=0}^{M-1} P_r\{d_k = 0, S_k = m, S_{k-1} = m', R_1^{k-1}, R_k, R_{k+1}^N\}} = \quad (6)$$

-continued $$\ln \frac{\sum_{m=0}^{M-1}\sum_{m'=0}^{M-1} P_r\{d_k=1, S_k=m, R_k \mid S_{k-1}=m'\}P_r\{S_{k-1}=m', R_1^{k-1}\}P_r\{R_{k+1}^N \mid S_k=m\}}{\sum_{m=0}^{M-1}\sum_{m'=0}^{M-1} P_r\{d_k=0, S_k=m, R_k \mid S_{k-1}=m'\}P_r\{S_{k-1}=m', R_1^{k-1}\}P_r\{R_{k+1}^N \mid S_k=m\}}.$$

In contrast with Berrou, we use the following new definitions on the forward and backward recursion probability functions $\alpha_k(m)$ and $\beta_k(m)$ by respectively setting $$\alpha_k(m)=P_r\{S_k=m, R_1^k\} \text{ and} \quad (7)$$

$$\beta_k(m)=P_r\{R_{k+1}^N \mid S_k=m\}. \quad (8)$$

Based on the newly-defined $\alpha_k(m)$ and $\beta_k(m)$, we express the log likelihood ratio $\Lambda(d_k)$ as:

$$\Lambda(d_k) = \ln \frac{\sum_{m=0}^{M-1}\sum_{m'=0}^{M-1} \gamma_1(R_k, m', m)\alpha_{k-1}(m')\beta_k(m)}{\sum_{m=0}^{M-1}\sum_{m'=0}^{M-1} \gamma_0(R_k, m', m)\alpha_{k-1}(m')\beta_k(m)} \quad (9)$$

where $\alpha_k(m)$ and $\beta_k(m)$ have the following simpler expressions than (2) and (3) in the conventional MAP method:

$$\alpha_k(m) = \sum_{m'=0}^{M-1}\sum_{i=0}^{1} \alpha_{k-1}(m')\gamma_i(R_k, m', m) = \sum_{m'=0}^{M-1} \alpha_{k-1}(m')\gamma(R_k, m', m) \quad (10)$$

-continued $$\beta_k(m) = \quad (11)$$
$$\sum_{m'=0}^{M-1}\sum_{i=0}^{1} \gamma_i(R_{k+1}, m', m)\beta_{k+1}(m') = \sum_{m'=0}^{M-1} \gamma(R_{k+1}, m, m')\beta_{k+1}(m')$$

where
$$\gamma(R_k, m', m)=\gamma_0(R_k, m', m)+\gamma_1(R_k,m',m). \quad (12)$$

Simplified MAP Decoding Method Steps

Thus, a simplified MAP method performs the following basic steps:

1) Firs, initialize forward recursion probability function vectors $\alpha_0(m)$, according to a boundary state condition $S_0=0$, as $$\alpha_0(0)=1; \alpha_0(m)=0 \forall m\neq 0.$$

2) Initialize the backward recursion probability function vector $\beta_N(m)$ as:

$$\beta_N(m)=1/M \forall m.$$

3) For each received bit $R_k$, determine $\gamma_i(R_k, m', m)$ according to the transition probabilities of the channel and the encoder trellis, and $\alpha_k(m)$ according to the simplified expression (10).

4) After the complete bit sequence $R_1^N$ has been received, determine $\beta_k(m)$ according to the simplified expression (11).

5) Determine the LLR $\Lambda(d_k)$ using the expression (9) as defined above.

Matrix Method for MAP Decoding

Because $\gamma_i(R_k, m', m)$ defined by expression (4) has $M \times M$ possible situations at time k, we represent it by an $M \times M$ matrix as $$\Gamma_i(R_k) = \begin{bmatrix} \gamma_i(R_k, 0, 0) & \gamma_i(R_k, 0, 1) & \ldots & \gamma_i(R_k, 0, M-1) \\ \gamma_i(R_k, 1, 0) & \gamma_i(R_k, 1, 1) & \ldots & \gamma_i(R_k, 1, M-1) \\ \vdots & \vdots & \ddots & \vdots \\ \gamma_i(R_k, M-1, 0) & \gamma_i(R_k, M-1, 1) & \ldots & \gamma_i(R_k, M-1, M-1) \end{bmatrix}. \quad (13)$$

In a similar way, we represent $\gamma(R_k, m', m)$ in expression (12) by another $M \times M$ matrix as $$\Gamma(R_k) = \begin{bmatrix} \gamma(R_k, 0, 0) & \gamma(R_k, 0, 1) & \ldots & \gamma(R_k, 0, M-1) \\ \gamma(R_k, 1, 0) & \gamma(R_k, 1, 1) & \ldots & \gamma(R_k, 1, M-1) \\ \vdots & \vdots & \ddots & \vdots \\ \gamma(R_k, M-1, 0) & \gamma(R_k, M-1, 1) & \ldots & \gamma(R_k, M-1, M-1) \end{bmatrix}, \quad (14)$$

and a forward recursion probability function vector as $$\alpha_k=[\alpha_k(0), \alpha_k(1), \ldots, \alpha_k(M-1)] \quad (15)$$

and a backward recursion probability function vector as:

$$\beta_k=[\beta_k(0), \beta_k(1), \ldots, \beta_k(M-1)]. \quad (16)$$

Thus, expressions (10), (11) and (9) respectively become:

$$\alpha_k=\alpha_{k-1}\Gamma(R_k) \quad k=1, 2, \ldots, N-1 \quad (17)$$

$$\beta_k^T=\Gamma(R_{k+1})\beta_{k+1}^T \quad k=N-1, N-2, \ldots, 1 \quad (18)$$

$$\Lambda(d_k) = \ln \frac{\alpha_{k-1}\Gamma_1(R_k)\beta_k^T}{\alpha_{k-1}\Gamma_0(R_k)\beta_k^T}. \quad (19)$$

From expressions (17) and (18), we obtain:

$$\alpha_k = \alpha_0 \Gamma(R_1)\Gamma(R_2) \ldots \Gamma(R_k), k=1, 2, \ldots, N-1 \quad (20)$$

$$\beta_k^T = \Gamma(R_{k+1})\Gamma(R_{k+2}) \ldots \Gamma(R_N)\beta N^T, k=N-1, N-2, \ldots, 1. \quad (21)$$

Therefore, the $\alpha_k$ and $\beta_k$ may be determined by a series of matrix multiplications between $\Gamma(R_k)$s. According to this feature, we devise the first matrix method for MAP decoding of turbo codes, denoted Matrix MAP Method 1, as follows:

Matrix MAP Method 1

Figure 2A:
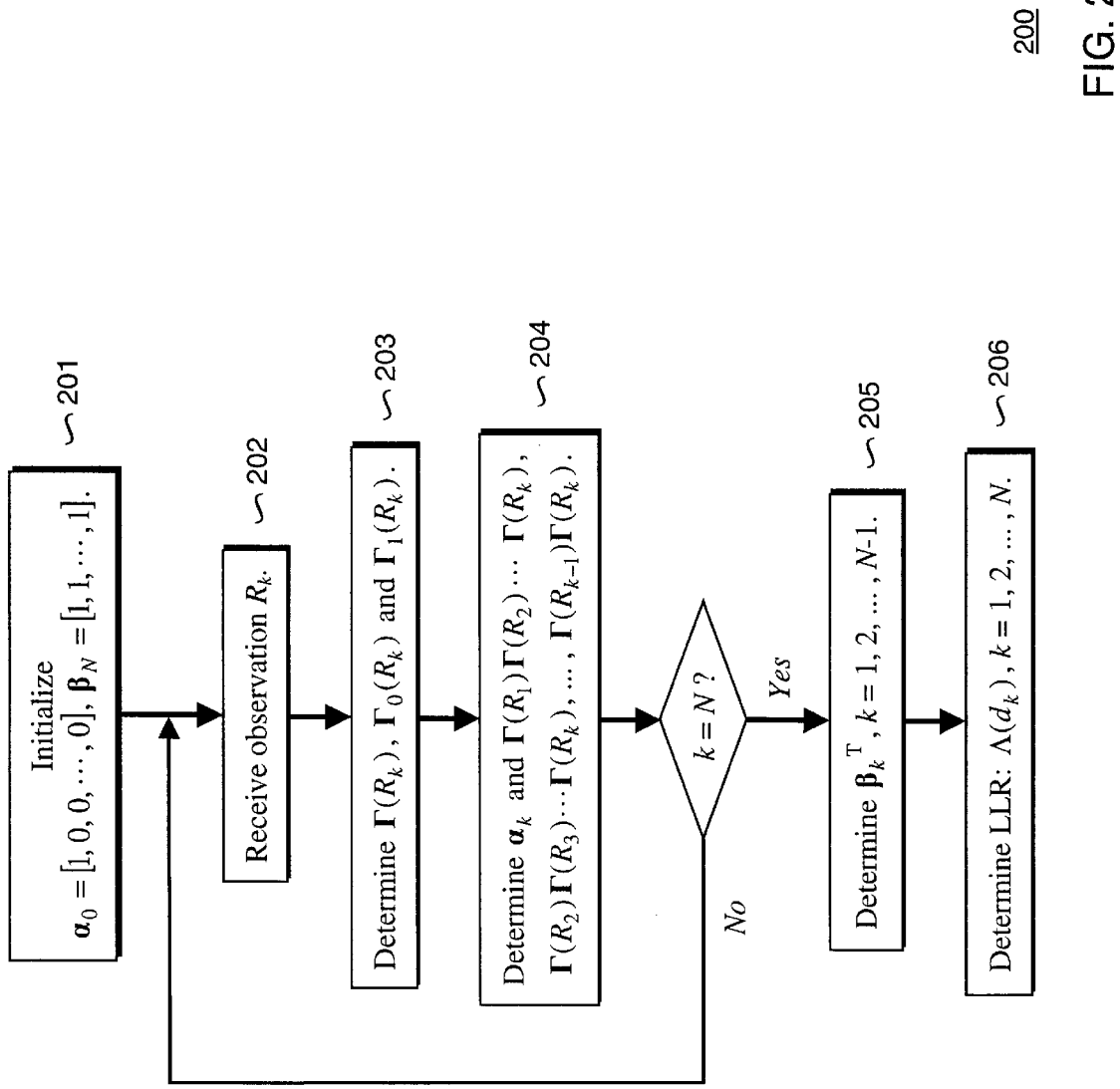
FIG. 2*a* is a flow diagram of a first matrix MAP decoding method according to the invention.

FIG. 2a shows the Matrix MAP method 1 200 as follows:

In step 201, initialize forward and backward recursion probability function vectors $\alpha_0$ and $\beta_N$ by setting:

$\alpha_0 = [1, 0, 0, \ldots, 0]$, and $\beta_N = [1, 1, \ldots, 1]$.

Note, our choice of $\beta_N$ is simpler than $\beta_N(m) = 1/M$, $\forall m$ used in the conventional MAP method.

For each received observation $R_k$ in step 202, determine three transition probability matrices $\Gamma_0(R_k)$, $\Gamma_1(R_k)$ and $\Gamma(R_k)$ using expressions (13) and (14), respectively, in step 203. And then, in step 204, determine $\alpha_k$ using expression (17), and at the same time, also determine $\Gamma(R_1)\Gamma(R_2) \ldots \Gamma(R_k)$, $\Gamma(R_2)\Gamma(R_3) \ldots \Gamma(R_k), \ldots, \Gamma(R_{k-1})\Gamma(R_k)$, in parallel.

After receiving the complete bit sequence $R_1^N$, determine the values of the vector $\beta_k^T$, k=1, 2, ..., N-1, using expression (21) in parallel in step 205. Then, determine the LLR $\Lambda(d_k)$, k=1, 2, ..., N, using expression (19) in parallel in step 206.

Apparatus for Matrix MAP Method 1

Figure 2B:
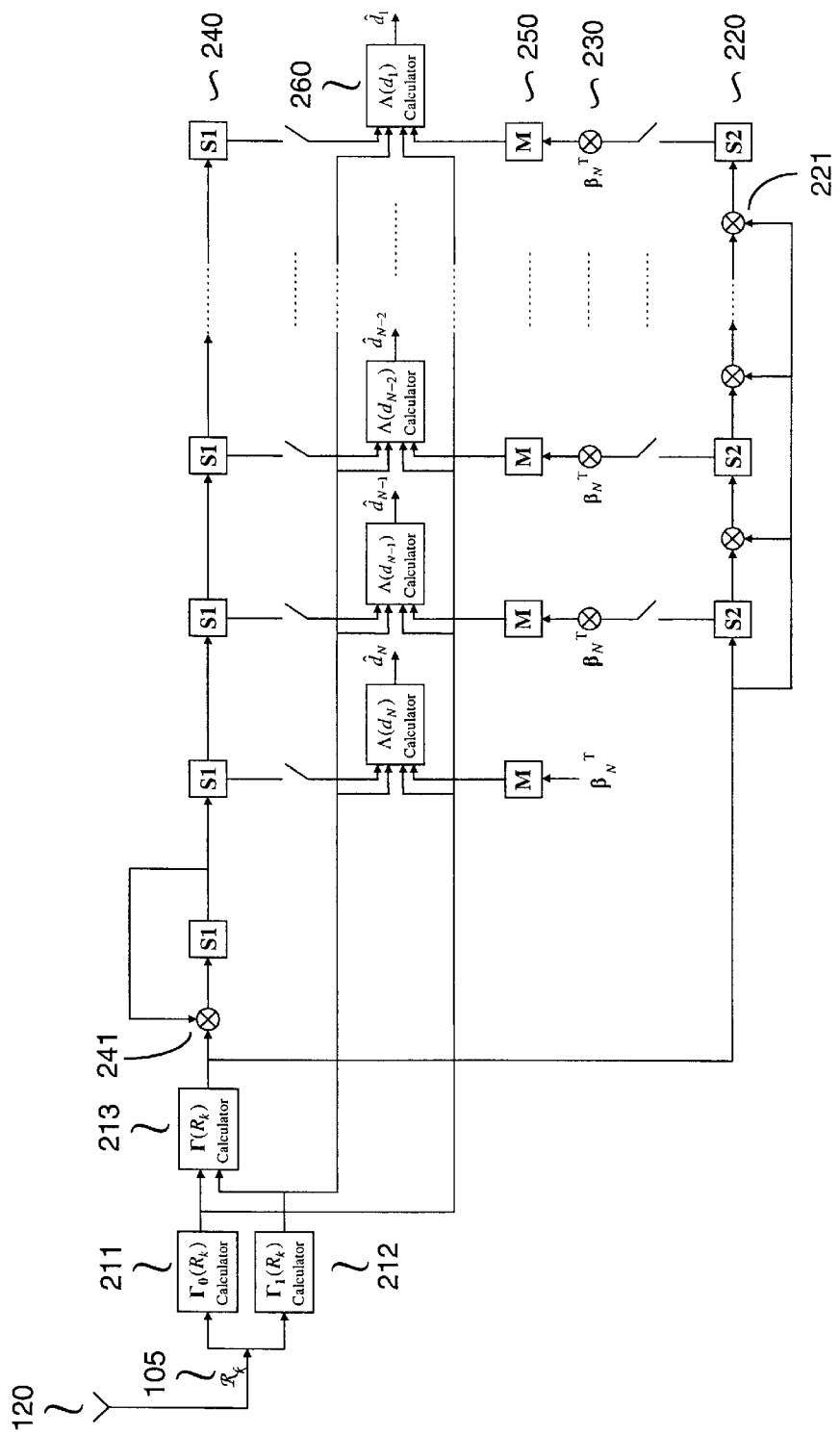
FIG. 2*b* is a circuit diagram of the first MAP decoding method.

FIG. 2b shows a hardware implementation architecture 210 for the Matrix MAP Method 1 200.

The matrix MAP decoder 210 receives the sequence 105 from the channel 120 of FIG. 1.

The decoder 210 includes three calculators 211–213 for determining the three transition probability matrices $\Gamma_0(R_k)$, $\Gamma_1(R_k)$ and $\Gamma(R_k)$ as defined above.

The decoder 210 includes a first shift register (S1) 240 linked by a first multiplier ⊗ 241, and a second shift register (S2) 220 linked by a second multiplier ⊗ 221. The shift register 240 has a length of N+1 and is initialized by $(\alpha_0, *, \ldots, *)$ at step 201 of the Matrix MAP Method 1 200. The first shift register is used to determine values $\alpha_0, \alpha_1, \ldots, \alpha_N$ of the forward recursion probability function vector $\alpha_0$. The shift register 220 has a length of N−1 and is used to determine $\Gamma(R_1)\Gamma(R_2) \ldots \Gamma(R_k), \Gamma(R_2)\Gamma(R_3) \ldots \Gamma(R_k), \ldots, \Gamma(R_{k-1})\Gamma(R_k)$.

The shift registers can be implemented using dual-ported memory, or a register file with independent read and write.

The decoder 210 also includes N−1 multipliers ⊗ 230. These multipliers are used to determine $\beta_k^T$, k=1, 2, ..., N−1 in parallel after receiving the complete sequence $R_1^N$ 105.

The decoder 210 also includes N storage elements (M) 250 and N LLR calculators 260. These LLR calculators are used to determine $\Lambda(d_k)$, k=1, 2, ..., N, k=1, 2, ..., N, in parallel. The values $\Lambda(d_k)$, k=1, 2, ..., N may temporarily be put in the N storage elements (M) 250 below the corresponding LLR calculators 260, before they are further processed to extract extrinsic information that are sent to the other constituent decoder.

Alternative Embodiment

If $\Gamma_i(R_k)$, $\Gamma(R_k)$, $\alpha_k$, $\beta_k$ and $\Lambda(d_k)$ are respectively defined by (13–16) and (19), then $$\Lambda(d_k) = \ln \frac{\alpha_0\Gamma(R_1)\Gamma(R_2) \ldots \Gamma(R_{k-1})\Gamma_1(R_k)\Gamma(R_{k+1})\Gamma(R_{k+2}) \ldots \Gamma(R_N)\beta_N^T}{\alpha_N\beta_N^T - \alpha_0\Gamma(R_1)\Gamma(R_2) \ldots \Gamma(R_{k-1})\Gamma_1(R_k)\Gamma(R_{k+1})\Gamma(R_{k+2}) \ldots \Gamma(R_N)\beta_N^T}. \quad (22)$$

The proof for the numerator of above expression (22) follows directly by substituting expressions (20) and (21) into (19).

The proof for the denominator of (22) is as follows:

$\alpha_{k-1}\Gamma_0(R_k)\beta_k^T$ $= \alpha_{k-1}(\Gamma(R_k) - \Gamma_1(R_k))\beta_k^T$ $= \alpha_{k-1}\Gamma(R_k)\beta_k^T - \alpha_{k-1}\Gamma_1(R_k)\beta_k^T$ $= \alpha_0\Gamma(R_1)\Gamma(R_2) \ldots \Gamma(R_N)\beta_N^T - \alpha_0\Gamma(R_1)\Gamma(R_2) \ldots \Gamma(R_{k-1})\Gamma_1(R_k)\Gamma(R_{k+1})\Gamma(R_{k+2}) \ldots \Gamma(R_N)\beta_N^T$ $\alpha_N\beta_N^T - \alpha_0\Gamma(R_1)\Gamma(R_2) \ldots \Gamma(R_{k-1})\Gamma_1(R_k)\Gamma(R_{k+1})\Gamma(R_{k+2}) \ldots \Gamma(R_N)\beta_N^T$ According to expression (22), we devise the second matrix method for MAP decoding of turbo codes, denoted Matrix MAP Method 2, as follows:

Matrix MAP Method 2

Figure 3A:
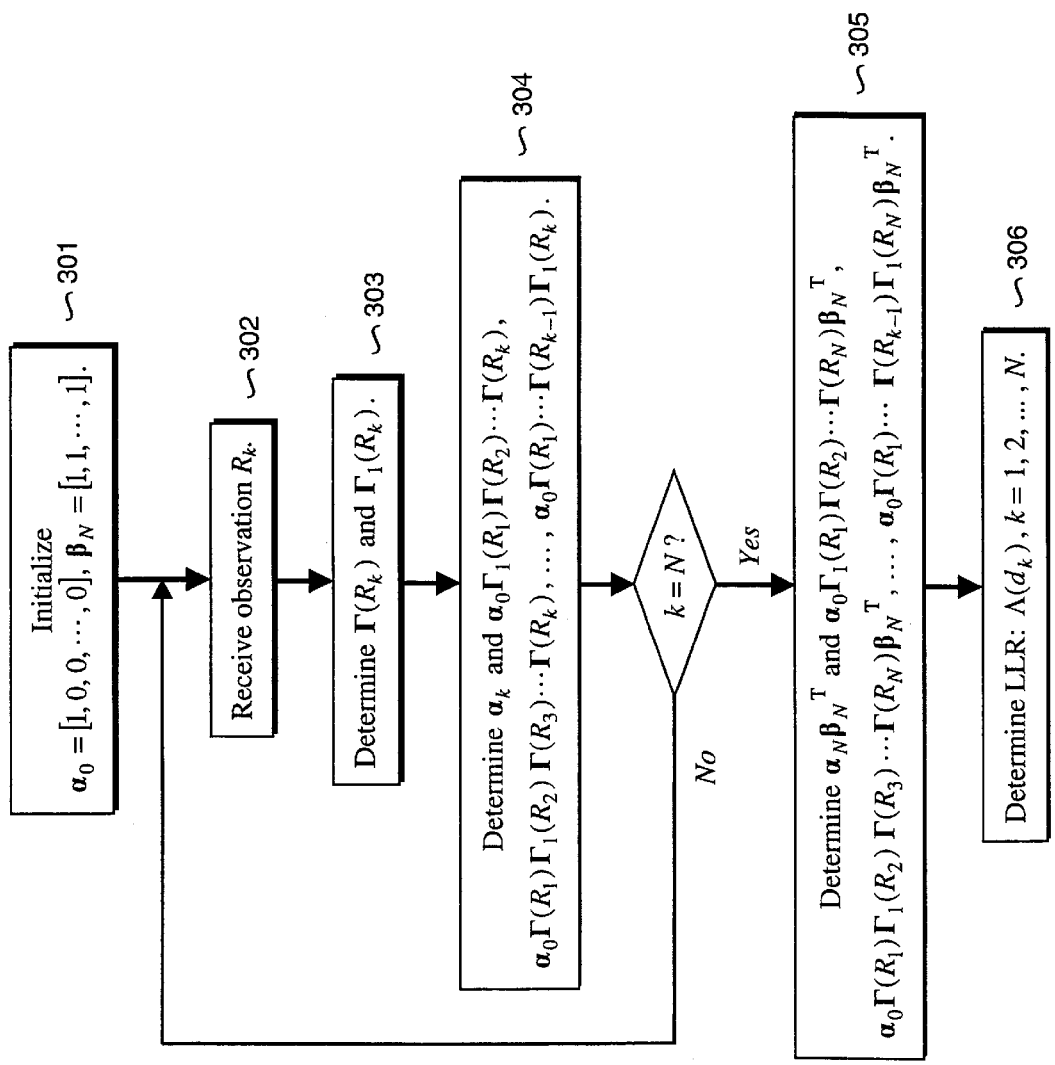
FIG. 3*a* is a flow diagram of a second matrix MAP decoding according to the alternative.

FIG. 3a shows the Matrix MAP Method 2 300 as follows.

In step 301, initialize forward and backward recursion probability function vectors $\alpha_0$ and $\beta_N$ as in step 201 above.

For each received observation $R_k$ in step 302, determine two transition probability matrices $\Gamma_1(R_k)$ and $\Gamma(R_k)$ using expressions (13) and (14), respectively, in step 303. And then, in step 304, determine $\alpha_k (= \alpha_0\Gamma(R_1)\Gamma(R_2) \ldots \Gamma(R_k))$ using (20), and at the same time, also determine $\alpha_0\Gamma_1(R_1)\Gamma(R_2) \ldots \Gamma(R_k)$, $\alpha_0\Gamma(R_1)\Gamma_1(R_2)\Gamma(R_3) \ldots \Gamma(R_k), \ldots, \alpha_0\Gamma(R_1) \ldots \Gamma(R_{k-1})\Gamma_1(R_k)$ in parallel.

After receiving the complete bit sequence $R_1^N$, determine $\alpha_N\beta_N^T (= \alpha_0\Gamma(R_1)\Gamma(R_2) \ldots \Gamma(R_N)\beta_N^T)$ and $\alpha_0\Gamma_1(R_1)\Gamma(R_2) \ldots \Gamma(R_N)\beta_N^T$, $\alpha_0\Gamma(R_1) \Gamma_1(R_2)\Gamma(R_3) \ldots \Gamma(R_N)\beta_N^T, \ldots, \alpha_0\Gamma(R_1) \ldots \Gamma(R_{k-1}) \Gamma_1(R_N)\beta_N^T$ in parallel in step 305. And then, determine LLR $\Lambda(d_k)$, k=1, 2, ..., N, using expression (22) in parallel in step 306.

Apparatus for Matrix MAP Method 2

Figure 3B:
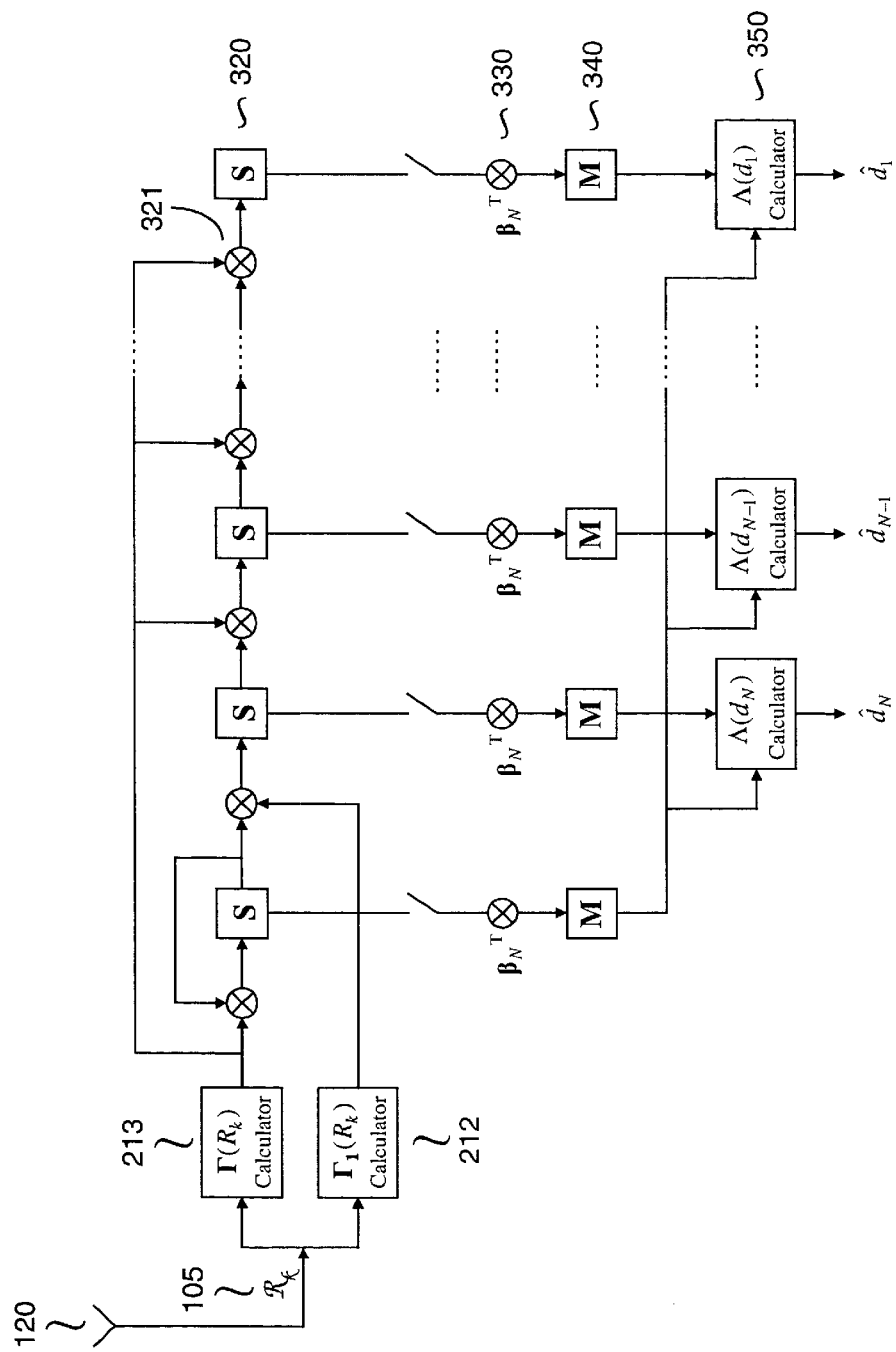
FIG. 3b is a circuit diagram of the second matrix MAP decoding method.

FIG. 3b shows a hardware implementation architecture 310 for the Matrix MAP Method 2 300.

The matrix MAP decoder 310 receives the sequences 105 from the channel 120 of FIG. 1.

The decoder 310 includes the two calculators 212–213 for determining the two transition probability matrices $\Gamma_1(R_k)$ and $\Gamma(R_k)$, as above.

The decoder 310 includes a shift register (S) 320 linked by multiplier ⓧ 321. This shift register has a length of N+1 and is initialized by $(\alpha_0, *, \ldots, *)$ at step 301 of the Matrix MAP Method 2 300. It is used to determine $\Gamma(R_1)\Gamma(R_2) \ldots \Gamma(R_k), \Gamma(R_2)\Gamma(R_3) \ldots \Gamma(R_k), \ldots, \Gamma(R_{k-1})\Gamma(R_k)$ in parallel.

The decoder 310 includes N+1 multipliers ⓧ 330. These multipliers are used to determine $\alpha_N \beta_N^T, \alpha_0 \Gamma_1(R_1)\Gamma(R_2) \ldots \Gamma(R_N)\beta_N^T, \alpha_0 \Gamma(R_1)\Gamma_1(R_2)\Gamma(R_3) \ldots \Gamma(R_N)\beta_N^T, \ldots, \alpha_0 \Gamma(R_1) \ldots \Gamma(R_{k-1})\Gamma_1(R_N)\beta_N^T$ in parallel after receiving the complete sequence $R_1^N$.

The decoder 310 also includes N+1 storage elements (M) 340 and N LLR calculators 350. These LLR calculators are used to determine $\Lambda(d_k)$, k=1, 2, ..., N in parallel. These $\Lambda(d_k)$, k=1, 2, ..., N, may temporarily be put in the N storage elements (M) 340 above the corresponding LLR calculators 350, before they are further processed to extract extrinsic information that are sent to another constituent decoder.

In a practical implementation, the number of LLR ($\Lambda$) calculator units 260 and 360 shown in FIGS. 2b and 3b can vary depending on the input symbol rate. For example, for a slower symbol rate, a reduced number of $\Lambda$ calculator units are used, with each unit calculating several $\Lambda(d_k)$ terms. This is done by operating the A calculator units at a clock speed higher than the symbol rate. This results in reduction in power consumption and circuit complexity.

Advantages

Processing Time

The biggest advantage of our matrix MAP decoding method is that it speeds up the decoding operations considerably. By using novel matrix transforms, our method reconstructs the MAP decoder structure into a set of simple and regular matrix formulations. As a result the matrix transforms can multiply different rows by their corresponding columns in parallel, and a substantial portion of the decoding procedure can be accomplished in parallel.

For instance, in both methods, the determination of $\alpha_k$ occurs in parallel with the series multiplications between $\Gamma(R_k)$. After the complete $R_1^N$ has T been received, all of $\beta_k^T$, k=1, 2, ..., N-1, (in method 1) and $\Lambda(d_k)$, k=1, 2, ..., N, (in both methods), can be determined in parallel. This eliminates the time required for successive backward recursion computations to determine $\beta_k$ in the conventional MAP algorithm.

Computational Complexity

Table A below lists a comparison on the forward-backward recursion computations throughout successive M trellis states at arbitrary time k required by different methods. The computational complexities of the matrix MAP decoding methods according to the invention are about one-half (for forward recursion) and one-fourth (for backward recursion), respectively, of the conventional MAP method. Besides, there is no division in such recursion computation of the matrix MAP decoding method. Division is a time consuming operation.

TABLE A

|  | Matrix MAP Methods | | MAP Method | |
|---|---|---|---|---|
|  |  |  | $\alpha_k$ (m) (m = 0, 1, ...,  | $\beta_k$ (m) (m = 0, 1, ...,  |
| Operation | $\alpha_k$ | $\beta_k$ | M − 1) | M − 1) |
| Addition | $M^2$ | $M^2$ | $2M^2$ | $2M^2$ |
| Multiplication | $2M^2$ | $2M^2$ | $4M^2$ | $4M^2$ |
| Division | 0 | 0 | M | M |

Memory Capacity

The conventional MAP method needs a substantial amount of storage, which is usually MN(2M+1). Adopting the implementation architectures using shift registers as shown in FIG. 2b and FIG. 3b, our matrix MAP methods effectively reduce memory capacity and simplify the complicated data accesses and transfers required by the conventional MAP method.

Operation Mode

As another key advantage, our matrix MAP decoding method can be implemented with efficient VLSI circuits. Acting on the M×M matrix and M-dimension vector, our method can be regarded as a VLSI oriented method. The novel parallel operation in our method provides for real-time MAP decoding for turbo codes in special-purpose, parallel processing VLSI hardware circuits.

Both the method and the apparatus described are generally applicable for channel decoding where turbo codes are used to combat radio signal propagation impairments and to ensure a low error rate communication link. In particularly, they can be used in wireless communication systems such as cellular phones, broadband wireless access systems, and mobile computing devices. They are also applicable for wire line systems such as ADSL, VDSL, xDSL, and home network systems.

Although the invention has been described by way of examples of above embodiments, it is to be understood that various other adaptations and modifications may be made within the spirit and scope of the invention. Therefore, it is the object of the appended claims to cover all such variations and modifications as come within the true spirit and scope of the invention.

We claim:

1. A method for decoding a turbo-encoded symbol sequence $R_1^N$ received via a noisy channel, comprising the steps of:

initializing a forward recursion probability function vector $\alpha_0$;

initializing a backward recursion probability function vector $\beta_N$;

determining a plurality of transition probability matrices for each received symbol $R_k$ of the sequence $R_1^N$, the plurality of probability matrices including a matrix $\Gamma(R_k)$;

determine values of the forward recursion probability function vector $\alpha_k$ according to $\Gamma(R_k)$ for each received symbol $R_k$ while multiplying the plurality of transition probability matrices in parallel;

determining a log likelihood ratio for each decoded bit $d_k$ in parallel after receiving the complete symbol sequence $R_1^N$.

2. The method of claim 1 wherein the forward recursion probability function vector $\alpha_0$ is initialized to [1, 0, 0, . . . , 0], the backward recursion probability function vector $\beta_N$ is initialized to [1, 0, 0, . . . , 0], and the plurality of transition probability matrices also includes $\Gamma_i(R_k)$, and further comprising the step of:

determining all of the values of the backward recursion probability function vector $\beta_k$, k=1,2, . . . , N−1, in parallel from results of the transition probability matrix multiplications between $\Gamma(R_k)$; and determining the log likelihood ratios from the values of the forward and backward recursion probability function vectors, as well as $\Gamma_i(R_k)$.

3. The method of claim 1 wherein the forward recursion probability function vector $\alpha_0$ is initialized to [1, 0, 0, . . . , 0], the backward recursion probability function vector $\beta_N$ is initialized to [1, 0, 0, . . . , 0], and the plurality of transition probability matrices also includes $\Gamma_1(R_k)$, and further comprising the steps of:

determining the log likelihood ratios from the values of forward recursion probability function vector and the results of the transition probability matrix multiplications between $\Gamma_1(R_k)$ and $\Gamma_i(R_k)$.

4. The method of claim 2 or 3 wherein $$\Gamma_i(R_k) = \begin{bmatrix} \gamma_i(R_k, 0, 0) & \gamma_i(R_k, 0, 1) & \ldots & \gamma_i(R_k, 0, M-1) \\ \gamma_i(R_k, 1, 0) & \gamma_i(R_k, 1, 1) & \ldots & \gamma_i(R_k, 1, M-1) \\ \vdots & \vdots & \ddots & \vdots \\ \gamma_i(R_k, M-1, 0) & \gamma_i(R_k, M-1, 1) & \ldots & \gamma_i(R_k, M-1, M-1) \end{bmatrix}$$

and $$\Gamma(R_k) = \begin{bmatrix} \gamma(R_k, 0, 0) & \gamma(R_k 0, 1) & \ldots & \gamma(R_k, 0, M-1) \\ \gamma(R_k, 1, 0) & \gamma(R_k, 1, 1) & \ldots & \gamma(R_k, 1, M-1) \\ \vdots & \vdots & \ddots & \vdots \\ \gamma(R_k, M-1, 0) & \gamma(R_k, M-1, 1) & \ldots & \gamma(R_k, M-1, M-1) \end{bmatrix}.$$

5. An apparatus for decoding a turbo-encoded symbol sequence $R_1^N$ received via a noisy channel, comprising the steps of:

a plurality of calculators for determining a plurality of transition probability matrices for each received symbol $R_k$ of the sequence $R_1^N$, the plurality of probability matrices including a matrix $\Gamma(R_k)$;

a first shift register, coupled to the plurality of calculators, configured to store values of a forward recursion probability function vector $\alpha_0$, the first shift register linked by a first multiplier;

a second shift register, coupled to the plurality of calculators, configured to store values of a backward recursion probability function vector $\beta_N$, the second shift register linked by a second multiplier;

a plurality of third multipliers configured to multiply the plurality of transition probability matrices in parallel while determining values of the forward recursion probability function vector $\alpha_k$ according to $\Gamma(R_k)$ for each received bit $R_k$; and means for determining a log likelihood ratio for each decoded symbol $R_k$ in parallel after receiving the complete symbol sequence $R_1^N$.

6. The apparatus of claim 5 wherein the forward recursion probability function vector $\alpha_0$ is initialized to [1, 0, 0, . . . , 0], the backward recursion probability function vector $\beta_N$ is initialized to [1, 0, 0, . . . , 0], and the plurality of transition probability matrices also includes $\Gamma_i(R_k)$, and further comprising:

means for determining values of the backward recursion probability function vector $\beta_N$ from results of the matrix multiplications; and means for determining the log likelihood ratios from the values of forward and backward recursion probability function vectors.

7. The apparatus of claim 5 wherein the forward recursion probability function vector $\alpha_0$ is initialized to [1, 0, 0, . . . , 0], the backward recursion probability function vectors $\beta_N$ is initialized to [1, 0, 0, . . . , 0], and the plurality of transition probability matrices include $\Gamma_1(R_k)$, and further comprising:

means for determining the log likelihood ratios from the values of forward and backward recursion probability function vectors.

8. The apparatus of claim 6 or 7 wherein $$\Gamma_i(R_k) = \begin{bmatrix} \gamma_i(R_k, 0, 0) & \gamma_i(R_k, 0, 1) & \ldots & \gamma_i(R_k, 0, M-1) \\ \gamma_i(R_k, 1, 0) & \gamma_i(R_k, 1, 1) & \ldots & \gamma_i(R_k, 1, M-1) \\ \vdots & \vdots & \ddots & \vdots \\ \gamma_i(R_k, M-1, 0) & \gamma_i(R_k, M-1, 1) & \ldots & \gamma_i(R_k, M-1, M-1) \end{bmatrix}$$

and $$\Gamma(R_k) = \begin{bmatrix} \gamma(R_k, 0, 0) & \gamma(R_k 0, 1) & \ldots & \gamma(R_k, 0, M-1) \\ \gamma(R_k, 1, 0) & \gamma(R_k, 1, 1) & \ldots & \gamma(R_k, 1, M-1) \\ \vdots & \vdots & \ddots & \vdots \\ \gamma(R_k, M-1, 0) & \gamma(R_k, M-1, 1) & \ldots & \gamma(R_k, M-1, M-1) \end{bmatrix}.$$

9. The apparatus of claim 5 wherein the length of the first shift register and the number of third multipliers is N+1.

10. The apparatus of claim 5 further comprising:

a plurality of storage elements configured to store the plurality of log likelihood ratios.

11. The apparatus of claim 5 wherein the plurality of calculators, the first and second shift registers, and the plurality of third multipliers are constructed as a single VLSI hardware circuit.

12. The apparatus of claim 5 wherein the first and second shift registers are dual-ported memory with independent read and write access.

13. The apparatus of claim 5 wherein the log likelihood ratio is $$\Lambda(d_k) = \ln \frac{\alpha_{k-1} \Gamma_1(R_k) \beta_k^T}{\alpha_{k-1} \Gamma_0(R_k) \beta_k^T}.$$

* * * * *